(12) United States Patent
Zhou et al.

(10) Patent No.: US 10,777,768 B2
(45) Date of Patent: Sep. 15, 2020

(54) ORGANIC LIGHT EMITTING DIODE ASSEMBLY, LIGHT SOURCE, AND METHOD OF FABRICATING ORGANIC LIGHT EMITTING DIODE ASSEMBLY

(71) Applicants: BOE Technology Group Co., Ltd., Beijing (CN); Chengdu BOE Optoelectronics Technology Co., Ltd., Chengdu, Sichuan (CN)

(72) Inventors: Weilong Zhou, Beijing (CN); De Yuan, Beijing (CN)

(73) Assignees: BOE Technology Group Co., Ltd., Beijing (CN); Chengdu BOE Optoelectronics Technology Co., Ltd., Chengdu, Sichuan (CN)

( * ) Notice: Subject to any disclaimer, the term of this patent is extended or adjusted under 35 U.S.C. 154(b) by 61 days.

(21) Appl. No.: 16/302,007

(22) PCT Filed: Nov. 23, 2017

(86) PCT No.: PCT/CN2017/112550
§ 371 (c)(1),
(2) Date: Nov. 15, 2018

(87) PCT Pub. No.: WO2019/100283
PCT Pub. Date: May 31, 2019

(65) Prior Publication Data
US 2019/0189953 A1    Jun. 20, 2019

(51) Int. Cl.
*H01L 51/52* (2006.01)
*H01L 51/50* (2006.01)
(Continued)

(52) U.S. Cl.
CPC .............. *H01L 51/525* (2013.01); *F21K 9/68* (2016.08); *F21S 6/003* (2013.01); *F21S 10/026* (2013.01);
(Continued)

(58) Field of Classification Search
CPC ........................... H01L 51/00–56; G09F 9/00
(Continued)

(56) References Cited

U.S. PATENT DOCUMENTS 5,969,475 A * 10/1999 Friend ................... H05B 33/12
313/498
6,091,197 A * 7/2000 Sun ..................... H01L 51/5265
313/509
(Continued)

FOREIGN PATENT DOCUMENTS

CN    102610631 A    7/2012
CN    104319352 A    1/2015
(Continued)

OTHER PUBLICATIONS

Machine translation, Hata, Japanese Pat. Pub. No. JP 2004-117500, translation date: Mar. 11, 2020, Espacenet, all pages. (Year: 2020).*
(Continued)

*Primary Examiner* — Victoria K. Hall
(74) *Attorney, Agent, or Firm* — Intellectual Valley Law, P.C.

(57) ABSTRACT

The present application discloses an organic light emitting diode assembly. The organic light emitting diode assembly includes a first base substrate; an organic light emitting diode on the first base substrate; and a second base substrate on a side of, the organic light emitting diode distal to the first base substrate. The organic light emitting diode and the second base substrate are spaced apart from each other by a tunable gap. A gap distance of the tunable gap is tunable
(Continued)

such that a color of light emitted from the organic light emitting diode assembly is tunable in response to a change in the gap distance.

18 Claims, 9 Drawing Sheets

(51) Int. Cl.
    *H01L 51/56*     (2006.01)
    *F21K 9/68*     (2016.01)
    *F21V 23/00*     (2015.01)
    *F21S 10/02*     (2006.01)
    *F21S 6/00*     (2006.01)
    *F21Y 115/15*     (2016.01)

(52) U.S. Cl.
    CPC ........ *F21V 23/003* (2013.01); *H01L 51/5012* (2013.01); *H01L 51/5262* (2013.01); *H01L 51/5265* (2013.01); *H01L 51/56* (2013.01); *F21Y 2115/15* (2016.08); *H01L 51/5218* (2013.01); *H01L 51/5234* (2013.01)

(58) Field of Classification Search
    USPC .......... 313/506, 508, 509, 511, 512
    See application file for complete search history.

(56) References Cited

U.S. PATENT DOCUMENTS

| | | | | |
|---|---|---|---|---|
| 6,677,709 | B1* | 1/2004 | Ma | G09G 3/3216 |
| | | | | 200/512 |
| 2013/0235572 | A1* | 9/2013 | Aurongzeb | F21S 6/002 |
| | | | | 362/231 |
| 2016/0295711 | A1* | 10/2016 | Ryu | H05K 5/03 |
| 2016/0343967 | A1 | 11/2016 | Dai et al. | |

FOREIGN PATENT DOCUMENTS

| | | |
|---|---|---|
| CN | 104851985 A | 8/2015 |
| CN | 107240647 A | 10/2017 |
| JP | 2004117500 A | 4/2004 |
| JP | 2004333953 A | 11/2004 |

OTHER PUBLICATIONS

International Search Report & Written Opinion dated Aug. 20, 2018, regarding PCT/CN2017/112550.

* cited by examiner forming an organic light emitting diode on a first base substrate

forming a second base substrate on a side of the organic light emitting diode distal to the first base substrate;
wherein the organic light emitting diode and the second base substrate are formed to be spaced apart from each other by a tunable gap; and
a gap distance of the tunable gap is formed to be tunable such that a color of light emitted from the organic light emitting diode assembly is tunable in response to a change in the gap distance

FIG. 12

ORGANIC LIGHT EMITTING DIODE ASSEMBLY, LIGHT SOURCE, AND METHOD OF FABRICATING ORGANIC LIGHT EMITTING DIODE ASSEMBLY

CROSS-REFERENCE TO RELATED APPLICATION

This application is a national stage application under 35 U.S.C. § 371 of International Application No. PCT/CN2017/112550, filed Nov. 23, 2017, the contents of which are incorporated by reference in the entirety.

TECHNICAL FIELD

The present invention relates to display technology, more particularly, to an organic light emitting diode assembly, a light source, and a method of fabricating an organic light emitting diode assembly.

BACKGROUND

An organic light emitting diode (OLED) typically includes an anode, an organic layer including a light emitting layer, and a cathode. Optionally, the organic light emitting diode may further includes one or a combination of a hole transport layer, a hole injection layer, an electron transport layer, and an electron injection layer. In an organic light emitting diode, an electric field is applied between the anode and the cathode to inject electrons from the cathode into the light emitting layer and holes from the anode into the light-emitting layer. The electrons and the holes then recombine together in the light emitting layer to generate excitons. When the excitons return to the ground state, their energy is released in the form of light.

SUMMARY

In one aspect, the present invention provides an organic light emitting diode assembly comprising a first base substrate; an organic light emitting diode on the first base substrate; and a second base substrate on a side of the organic light emitting diode distal to the first base substrate; wherein the organic light emitting diode and the second base substrate are spaced apart from each other by a tunable gap; and a gap distance of the tunable gap is tunable such that a color of light emitted from the organic light emitting diode assembly is tunable in response to a change in the gap distance.

Optionally, the organic light emitting diode assembly comprises a microcavity; wherein a light path in the microcavity extends through the tunable gap; and the gap distance of the tunable gap is tunable such that a total light path distance of the microcavity is tunable in response to the change in the gap distance.

Optionally, a change in the gap distance is substantially linearly correlated with a change in a maximum-gain wavelength of light emitted from the organic light emitting diode assembly.

Optionally, the organic light emitting diode assembly further comprises an elastic spacer layer spacing apart the organic light emitting diode and the second base substrate by the tunable gap; wherein the elastic spacer layer is capable of undergoing deformation in response to an external force thereby actuating the gap distance.

Optionally, the organic light emitting diode assembly further comprises a rigid spacer layer on the first base substrate; wherein a height of the rigid spacer layer relative to the first base substrate is less than a height of the elastic spacer layer relative to the first base substrate when the gap distance is greater than zero.

Optionally, the organic light emitting diode comprises a first electrode on the first base substrate; an organic layer on a side of the first electrode distal to the first base substrate; and a second electrode on a side of the organic layer distal to the first electrode; wherein the organic layer comprises an organic light emitting layer.

Optionally, the second electrode is a substantially transparent electrode; and the second base substrate is a reflective substrate or a transflective substrate.

Optionally, the first electrode is a reflective electrode or a transflective electrode.

Optionally, the first base substrate is a reflective substrate or a transflective substrate.

In another aspect, the present invention provides a light source comprising the organic light emitting diode assembly described herein or fabricated by a method described herein.

Optionally, the light source further comprises an actuator configured to control the gap distance of the tunable gap.

Optionally, the actuator comprises a rigid support plate and a resilient support pad; the resilient support pad is configured to apply a compressive force on the organic light emitting diode assembly; and the rigid support plate is configured to apply a pulling force on the resilient support pad.

Optionally, the light source further comprises a transmission line operably coupled to the rigid support plate for providing the pulling force.

Optionally, the light source further comprises a change-speed gear box operably coupled to the transmission line and configured to change a transmission speed of the transmission line; and the change-speed gear box comprises a plurality of change-speed gears.

Optionally, the light source further comprises a driving pulley, around which the transmission line is wound for multiple turns; and the transmission line is operably connected to the plurality of change-speed gears in the change-speed gear box through one or more fixed pulleys.

Optionally, the light source further comprises a controller knob operably coupled to the driving pulley configured to control a magnitude of the pulling force applied on the resilient support pad.

Optionally, the actuator comprises a support plate and an electroactive layer sandwiched between the support plate and the organic light emitting diode assembly; and the electroactive layer is configured to exert a force to the elastic spacer layer in response to an electrical signal, thereby changing the gap distance of the tunable gap.

Optionally, the light source further comprises a controller knob operably coupled to the electroactive layer configured to controlling a magnitude of the electrical signal applied on the electroactive layer.

Optionally, the light source further comprises a base, a controller knob on the base, a lamp head for receiving the organic light emitting diode assembly, and one or more struts connecting the base to the lamp head.

In another aspect, the present invention provides a method of fabricating an organic light emitting diode assembly, comprising forming an organic light emitting diode on a first base substrate; and forming a second base substrate on a side of the organic light emitting diode distal to the first base substrate; wherein the organic light emitting diode and the second base substrate are formed to be spaced apart from each other by a tunable gap; and a gap distance of the tunable gap is formed to be tunable such that a color of light emitted from the organic light emitting diode assembly is tunable in response to a change in the gap distance.

BRIEF DESCRIPTION OF THE FIGURES

The following drawings are merely examples for illustrative purposes according to various disclosed embodiments and are not intended to limit the scope of the present invention.

FIG. 12 is a flow chart illustrating a method of fabricating an organic light emitting diode assembly in some embodiments according to the present disclosure.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

Conventional organic light emitting diode light sources typically have fixed specifications, for example, they are typically made for emitting a designated color of light. The color of light in the conventional organic light emitting diode light sources is typically not tunable. Personalized preferences of individual users are difficult to be satisfied using conventional organic light emitting diode light sources, either decorative light sources or light sources for illumination purpose. Color tunable light sources may be made, e.g., using a stacked organic light emitting diode in which both light intensity and color could be independently varied and controlled with external power supplies. The stacked organic light emitting diode light sources, however, require complicated circuits to control the color of emitted light, leading to high manufacturing costs and a complicated fabricating process.

Accordingly, the present disclosure provides, inter alia, an organic light emitting diode assembly, a light source, and a method of fabricating an organic light emitting diode assembly that substantially obviate one or more of the problems due to limitations and disadvantages of the related art. In one aspect, the present disclosure provides an organic light emitting diode assembly. In some embodiments, the organic light emitting diode assembly includes a first base substrate; an organic light emitting diode on the first base substrate; and a second base substrate on a side of the organic light emitting diode distal to the first base substrate. Optionally, the organic light emitting diode and the second base substrate are spaced apart from each other by a tunable gap. Optionally, a gap distance of the tunable gap is tunable such that a color of light emitted from the organic light emitting diode assembly changes in response to a change in the gap distance. The present disclosure provides a simple yet robust color tunable light source that obviates high manufacturing costs and the complicated fabricating process associated with the stacked organic light emitting diode light source.

Figure 1:
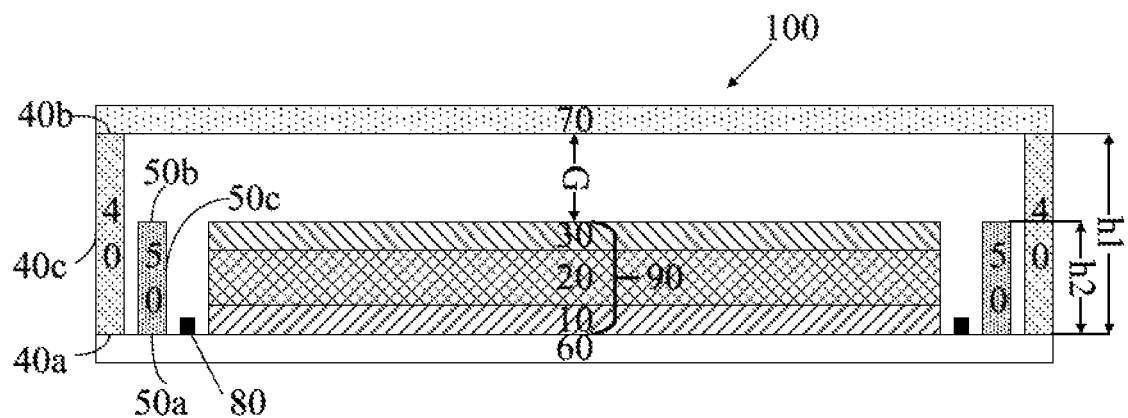
FIG. 1 is a diagram illustrating the structure of an organic light emitting diode assembly in some embodiments according to the present disclosure.
Figure 2:
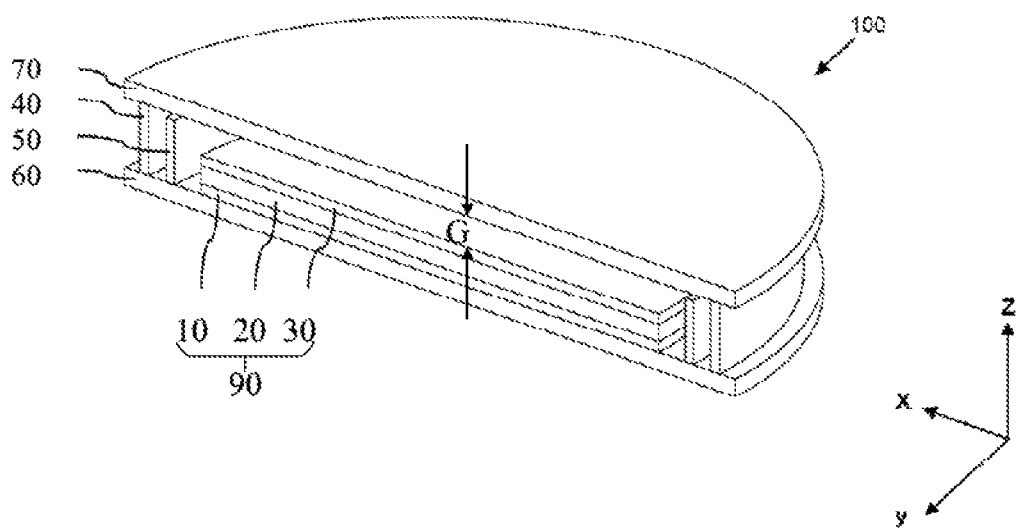
FIG. 2 a perspective view of an organic light emitting diode assembly in some embodiments according to the present disclosure.

FIG. 1 is a diagram illustrating the structure of an organic light emitting diode assembly in some embodiments according to the present disclosure. FIG. 2 a perspective view of an organic light emitting diode assembly in some embodiments according to the present disclosure. Referring to FIG. 1 and FIG. 2, the organic light emitting diode assembly 100 in some embodiments includes a first base substrate 60; an organic light emitting diode 90 on the first base substrate 60; and a second base substrate 70 on a side of the organic light emitting diode 90 distal to the first base substrate 60. In the present organic light emitting diode assembly 100, the organic light emitting diode 90 and the second base substrate 70 are spaced apart from each other by a tunable gap G. A gap distance of the tunable gap G can be actuated such that a color of light emitted from die organic light emitting diode assembly 100 changes in response to a change in the gap distance. Optionally, a change in the gap distance has a substantially linear correlation with a change in a maximum-gain wavelength of light emitted from the organic light emitting diode assembly 100. By changing the gap distance, a full color tunable organic light emitting diode can be achieved to display a full spectrum of visible light.

The tunable gap G may be filled with any appropriate medium as long as it allows the gap distance to be tunable. Optionally, the tunable gap G is a vacuum. Optionally, the tunable gap G is filled with a gas such as an insert gas. Examples of insert gases include nitrogen, helium, argon, and the like. Optionally, the tunable gap G is filled with a transparent insulating liquid such as a transparent insulating dielectric liquid. Examples of insulating liquids include mineral oils, silicone oils, and hydrocarbons. Optionally, the tunable gap G is filled with an elastic, transparent, insulating solid such as a transparent lubricant.

Various appropriate mechanisms may be used for actuating the gap distance. The actuator may be mechanical or electrical. In some embodiments, the organic light emitting diode assembly 100 further includes an elastic spacer layer 40 spacing apart the organic light emitting diode 90 and the second base substrate 70 by the tunable gap G. The elastic spacer layer 40 is capable of undergoing deformation in response to an external force thereby actuating the gap distance G. As shown in FIG. 1, the elastic spacer layer 40 has a first surface 40a connected (directly or indirectly) to the first base substrate 60, a second surface 40b connected (directly or indirectly) to the second base substrate 70, and a side wall 40c connecting the first surface 40a and the second surface 40b. Optionally, the first surface 40a is in contact with the first base substrate 60. Optionally, the second surface 40b is in contact with the second base substrate 70. The side wall 40c has a height h1 defined by a distance between the first surface 40a and the second surface 40b. The height h1 changes in response to a deformation occurring in the elastic spacer layer 40, thereby changing the gap distance of the tunable gap G.

In some embodiments, the height h1 of the elastic spacer layer 40 may be actuated mechanically. In one example, the elastic spacer layer 40 is connected to a spring which, when controlled, may (directly or indirectly) exert a pressing force on one or a combination of the first surface 40a and the second surface 40b. Optionally, the pressing force is applied on the second base substrate and is transmitted to the elastic spacer layer 40.

In some embodiments, the height h1 of the elastic spacer layer 40 may be actuated electrically. In one example, the organic light emitting diode assembly further includes an electroactive layer on a side of the first surface 40a, or on a side of the second surface 40b, or on both sides. In response to an electrical signal applied to the electroactive layer, the electroactive layer is configured to exert a pressing force (directly or indirectly) on one or a combination of the first surface 40a and the second surface 40b.

Optionally, the height h1 of the elastic spacer layer 40 is substantially the same as a sum of the gap distance and a thickness of the organic light emitting diode 90.

Optionally, the elastic spacer layer 40 is made of a substantially transparent material. As used herein, the term "substantially transparent" means at least 70 percent (e.g., at least 75 percent, at least 80 percent, at least 85 percent, at least 90 percent, at least 95 percent and 100 percent) of light in the visible wavelength range transmitted therethrough.

Various appropriate elastic materials may be used for making the elastic spacer layer 40. As used herein, the term "elastic" refers to a material that, upon application of a biasing force, can stretch to an elongated length of at least about 110% of its relaxed, original length (i.e. can stretch to 10 percent more than its original length), without rupture or breakage, and upon release of the applied force, recovers at least about 40% of its elongation. For example, a material that has an initial length of 100 mm can extend at least to 110 mm, and upon removal of the force would retract to a length of 106 mm (40% recovery). Examples of appropriate elastic materials for making the elastic spacer layer 40 includes elastomers (i.e., viscoelastic polymers) such as polyimides, polysilicones, polysiloxanes, rubbers, urethane polyimides, polyepoxides, and so on. Optionally, an elastic material is a material having a Young's modulus value less than 500 MPa, e.g., less than 400 MPa, less than 300 MPa, less than 200 MPa, less than 100 MPa, and less than 50 MPa. Optionally, an elastic material is a material having a Young's modulus value less than 20 MPa, e.g., less than 15 MPa, less than 10 MPa, less than 5 MPa, less than 2 MPa, and less than 1 MPa.

In some embodiments, the organic light emitting diode assembly 100 further includes a rigid spacer layer 50 on the first base substrate 60 for protecting the organic light emitting diode 90. As shown in FIG. 1, the rigid spacer layer 50 has a first surface 50a connected (directly or indirectly) to the first base substrate 60, a second surface 50b spaced apart from the second base substrate 70, and a side wall 50c connecting the first surface 50a and the second surface 50b. The second surface 50b is on a side of the first surface 50a distal to the first base substrate 60. Optionally, the first surface 50a is in contact with the first base substrate 60. The side wall 50c has a height h2 defined by a distance between the first surface 50a and the second surface 50b. The height h2 of the rigid spacer layer 50 relative to the first base substrate 60 is less than the height h1 of the elastic spacer layer 40 relative to the first base substrate 60 when the gap distance of the tunable gap G is greater than zero.

To protect the organic light emitting diode 90, the height h2 of the rigid spacer layer 50 relative to the first base substrate 60 is substantially equal to, or greater than, a height of the organic light emitting diode 90 relative to the first base substrate 60. When the gap distance of the tunable gap G is actuated to zero, the rigid spacer layer 50 is in position to prevent the organic light emitting diode 90 from being pressed by the second base substrate 70.

Various appropriate rigid materials may be used for making the rigid spacer layer 50. As used herein, the term "rigid" refers to a material that does not flex or elastically deform readily upon application of a biasing force. Optionally, a rigid material is a material having a Young's modulus value greater than 500 MPa at room temperature. Optionally, the rigid spacer layer 50 has a Young's modules of at least 500 MPa, at least 1000 MPa, at least 5000 MPa, at least 10000 MPa, at least 100000 MPa, or at least 200000 MPa. Examples of appropriate rigid materials include polycarbonate, acrylic, polypropylene, and polystyrene.

Referring to FIG. 1, the organic light emitting diode assembly 100 in some embodiments includes a first electrode 10 on the first base substrate 60; an organic layer 20 on a side of the first electrode 10 distal to the first base substrate 60; and a second electrode 30 on a side of the organic layer 20 distal to the first electrode 10. The organic light emitting diode assembly 100 in some embodiments further includes a plurality of conductive wires 80. A cathode and an anode of the organic light emitting diode 90 are respectively connected to the plurality of conductive wires 80.

Figure 3:
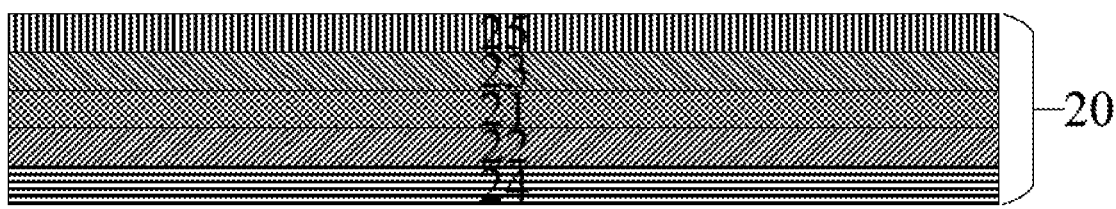
FIG. 3 is a diagram illustrating the structure of an organic layer in some embodiments according to the present disclosure.

FIG. 3 is a diagram illustrating the structure of an organic layer in some embodiments according to the present disclosure. Referring to FIG. 3, the organic layer 20 in some embodiments includes an organic light emitting layer 21. Optionally, the organic layer 20 further includes other functional layers such as a hole transport layer, a hole injection layer, an electron transport layer, and an electron injection layer. Referring to FIG. 1 and FIG. 3, the organic layer 20 in some embodiments includes a hole injection layer 24 on the first electrode 10, a hole transport layer 22 on a side of the hole injection layer 24 distal to the first electrode 10, the organic light emitting layer 21 on a side of the hole transport layer 22 distal to the hole injection layer 24, an electron transport layer 23 on a side of the organic light emitting layer 21 distal to the hole transport layer 22, and an electron injection layer 25 on a side of the electron transport layer 23 distal to the organic light emitting layer 21.

Optionally, the first electrode 10 is an anode, and the second electrode 30 is a cathode. Optionally, the first electrode 10 is a cathode, and the second electrode 30 is an anode.

In some embodiments, a microcavity is formed between two reflective/transflective layers of the organic light emitting diode assembly. Optionally, the second electrode 30 is substantially transparent. Optionally, the first electrode 10 is a reflective electrode or a transflective electrode. Optionally, the second base substrate 70 is a reflective substrate or a transflective substrate.

As used herein, the term "reflective" refers to an object having a reflectivity of approximately 70% to approximately 100% relative to an incident light, the term "transflective" refers to an object having a reflectivity of approximately 30% to approximately 70% with respect to an incident light, and the term "substantially transparent" refers to an object having a reflectivity of approximately 0% to approximately 30% with respect to an incident light.

In one example, the first electrode 10 is a reflective electrode, the second electrode 30 is a substantially transparent electrode, and the second base substrate 70 is a transflective substrate. The microcavity is formed between the first electrode 10 which is reflective and the second base substrate 70 which is transflective.

In another example, the first electrode 10 is a transflective electrode, the second electrode 30 is a substantially transparent electrode, and the second base substrate 70 is a transflective substrate. Optionally, the first base substrate 60 is a substantially transparent substrate. The microcavity is formed between the first electrode 10 and the second base substrate 70, both of which are transflective.

In another example, the first base substrate 60 is a reflective substrate, the first electrode 10 is a substantially transparent electrode, the second electrode 30 is a substantially transparent electrode, and the second base substrate 70 is a transflective substrate. The microcavity is formed between the first base substrate 60 which is reflective and the second base substrate 70 which is transflective.

In another example, the first base substrate 60 is a transflective substrate, the first electrode 10 is a substantially transparent electrode, the second electrode 30 is a substantially transparent electrode, and the second base substrate 70 is a transflective substrate. The microcavity is formed between the first base substrate 60 and the second base substrate 70, both of which are transflective.

In another example, the first base substrate 60 is a transflective substrate, the first electrode 10 is a substantially transparent electrode, the second electrode 30 is a substantially transparent electrode, and the second base substrate 70 is a reflective substrate. The microcavity is formed between the first base substrate 60 which is transflective and the second base substrate 70 which is reflective.

Referring to FIG. 1, the organic light emitting diode assembly 100 in the example includes a microcavity M formed between a first electrode 10 which is reflective and a second base substrate 70 which is transflective. A light path in the microcavity M extends through the tunable gap G. The gap distance of the tunable gap G is tunable such that a total light path distance of the microcavity M is tunable in response to the change in the gap distance.

Figure 4:
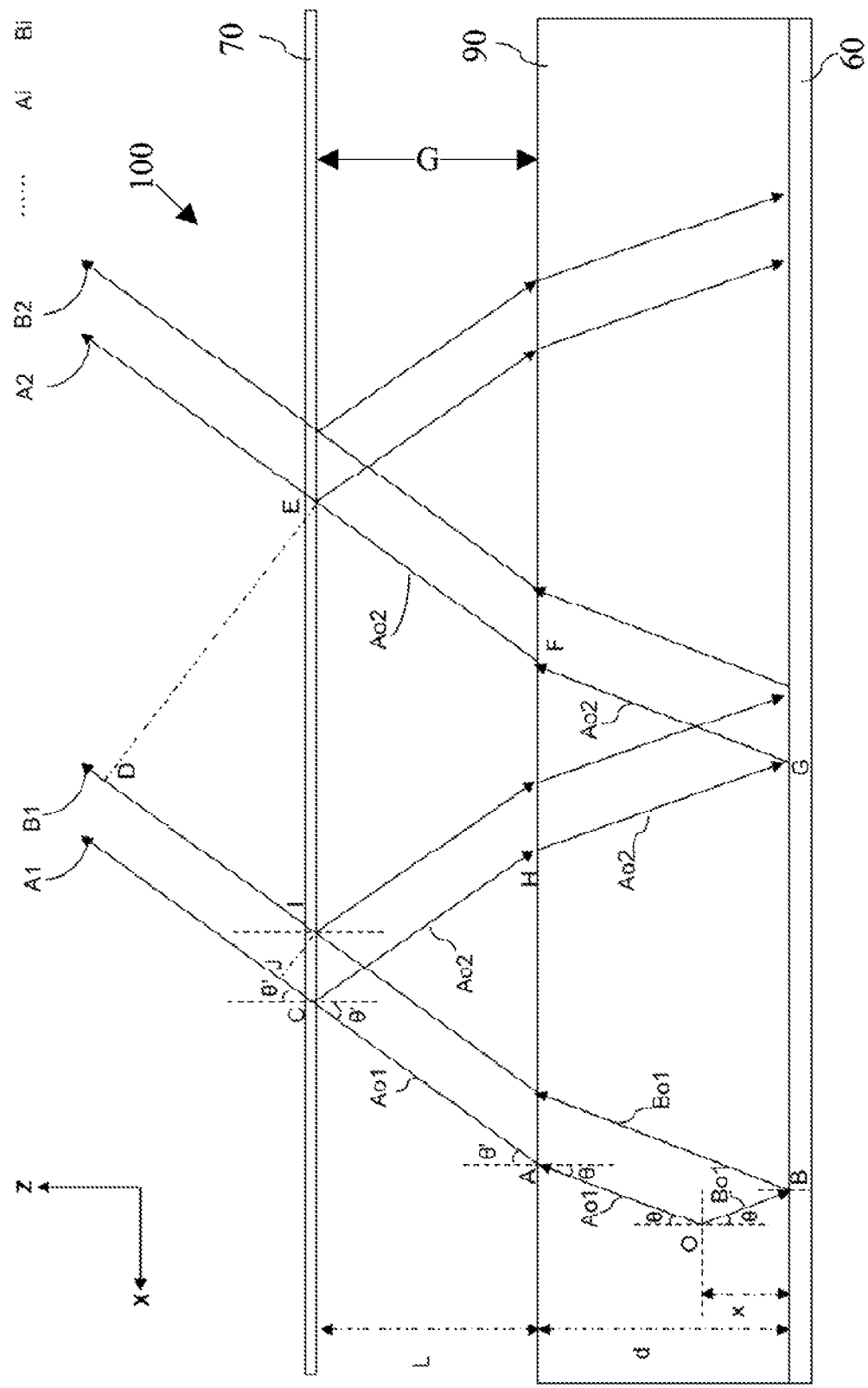
FIG. 4 is a diagram illustrating the working principle of an organic light emitting diode assembly in some embodiments according to the present disclosure.

FIG. 4 is a diagram illustrating the working principle of an organic light emitting diode assembly in some embodiments according to the present disclosure. Referring to FIG. 4, the tunable gap G between the organic light emitting diode 90 and the second base substrate 70 has a gap distance L. The organic light emitting diode 90 has a thickness d. The point O is a point in the organic light emitting layer of the organic light emitting diode 90, from which light emits, e.g., toward the first base substrate 60 (e.g., along O-B direction) or the second base substrate 70 (e.g., along O-A direction). A normal distance between the point O and the upper surface of the first base substrate 60 is indicated as "x".

In the example depicted in FIG. 4, a microcavity is formed between the first base substrate 60 and the second base substrate 70. Light emitted out of the organic light emitting diode assembly 100 is a light modulated by the microcavity effect. For example, light emitted from the point O includes light Ao1 and light Bo1 having a mirror symmetry with respect to the horizontal line. Light Ao1 travels along O-A, reaches a point A on the upper surface of the organic light emitting diode 90, and enters into the tunable gap G between the organic light emitting diode 90 and the second base substrate 70. At the interface between the organic light emitting diode 90 and the tunable gap G, light Ao1 has an incent angle of θ, and an exit angle of θ'. Light Ao1 then travels along the A-C line, reaches a point C on the second base substrate 70, and emits out of the organic light emitting diode assembly 100 as light A1. Optionally, the tunable gap G is filled with nitrogen, which has a refractive index very similar to that of the air. Accordingly, at the interface between the second base substrate 70 and the air (e.g., at point C), light Ao1 has an incident angle of θ', and an exit angle of θ'.

Optionally, the second base substrate 70 is a transflective substrate. Accordingly, a portion of light Ao1 is reflected by the second base substrate 70 at the interface between the second base substrate 70 and the air (e.g., at point C). The reflected light Ao2 travels through the tunable gap G and the organic light emitting diode 90 along C-H-G line, and reaches an upper surface of the first base substrate 60. Optionally, the first base substrate 60 is a reflective substrate, and light Ao2 is reflected by the first base substrate 60, travels along the G-F-E line. At the interface between the second base substrate 70 and the air, a portion of light Ao2 emits out of the organic light emitting diode assembly as light A2, and a portion of light Ao2 is again reflected by the transflective first base substrate 60. The process is reiterated multiple times, thereby generating a series of emitted light A1, A2, A3, . . . , $A_n$.

Similarly, light Bo1 emitted from the point O undergoes the similar process in the organic light emitting diode assembly, and generates a series of emitted light B1, B2, B3, . . . , $B_n$. An observer at a viewing angle θ' observes a combined light of A1, A2, A3, . . . , $A_n$, and B1, B2, B3, . . . , $B_n$.

The microcavity effect of the organic light emitting diode assembly 100 depends on the gap distance L. A light path difference Δ between the emitted light A1 and the emitted light A2, can be calculated based on the equation (1):

$$\Delta = 2nd \cos\theta + 2n'L \cos\theta' \tag{1}$$

wherein n stands for an average refractive index of the organic light emitting diode 90; n' stands for a refractive index of the tunable gap G; d stands for a thickness of the organic light emitting diode 90; and L stands for a gap distance of the tunable gap G.

A phase difference Δφ between the emitted light A1 and the emitted light A2, can be calculated based on the equation (2):

$$\Delta\varphi = \frac{4\pi}{\lambda}(nd\cos\theta + n'L\cos\theta') + \varphi; \tag{2}$$

wherein λ stands for a wavelength of the incident light, φ stands for a phase shift due to light reflection at the first base substrate 60 and the second base substrate 70.

The wave function of the light A1 can be expressed using the equation (3):

$$\Psi(o,t)_{A1} = t_{US}Ae^{-i(\omega t - ko + \psi_0)} = t_{US}\Psi(o,t)_0 \tag{3}$$

wherein ω stands for an angular frequency of the emitted light A1; $(-i(\psi_0-ko))$ stands for a spatial phase factor; $-i\psi t$ stands for a temporal phase factor; $t_{US}$ stands for light transmittance of the second base substrate 70, and $\Psi(o, t)_0$ stands for a wave function of light Ao1.

Base on the equation (3), the wave function of the light A2 can be expressed using the equation (4):

$$\Psi(o,t)_{A2} = t_{US} r_{US} r_{BS} A e^{-i(\omega t - k o + \psi_0 + \Delta\varphi)} = t_{US} \Psi(o,t)_0 r_{US} r_{BS} e^{-i\Delta\varphi} \quad (4)$$

wherein $r_{US}$ stands for light reflectance of the second base substrate 70; and $r_{bs}$ stands for light reflectance of the first base substrate 60.

Base on the equations (3) and (4), a sum of the wave functions of the light A1, A2, A3, ..., $A_n$ can be expressed using the equation (4):

$$\Psi(o, t)_A = \quad (5)$$
$$\Psi(o, t)_{A1}\left[1 + (r_{US} r_{BS} e^{-i\Delta\varphi}) + (r_{US} r_{BS} e^{-i\Delta\varphi})^2 + \ldots + (r_{US} r_{BS} e^{-i\Delta\varphi})^n\right] =$$
$$t_{US}\Psi(o, t)_0 \frac{1}{1 - r_{US} r_{BS} e^{-i\Delta\varphi}}.$$

A light path difference $\Delta'$ between the emitted light A1 and the emitted light B1, i.e., a light path different between the emitted light A1 at point J and the emitted light B1 at point I, can be calculated based on the equation (6):

$$\Delta' = 2nx \cos\theta \quad (6)$$

wherein x stands for a normal distance between the point O (light emitting point) and the first base substrate 60.

Based on the equation (6), the phase difference between light A1 and light B1 can be expressed using the equation (7):

$$\Delta\varphi' = \frac{4\pi}{\lambda} nx\cos\theta + \varphi'; \quad (7)$$

wherein $\varphi'$ stands for a phase shift due to light reflection at the first base substrate 60.

Based on the equations (3) and (7), the wave function alight B1 can be expressed using the equation (8):

$$\Psi(o,t)_{B1} = t_{US}\Psi(o,t)_0 r_{BS} e^{-i\Delta\varphi'} \quad (8).$$

Based on the equation (8), the wave function of light B2 can be expressed using the equation (9):

$$\Psi(o,t)_{B2} = \Psi(o,t)_{B1} r_{US} r_{BS} e^{-i\Delta\varphi} \quad (9).$$

Based on the equation (9), a sum of the wave functions of the light B1, B2, B3, ..., $B_n$ can be expressed using the equation (10):

$$\Psi(o, t)_B = \Psi(o, t)_{B1}\left[1 + (r_{US} r_{BS} e^{-i\Delta\varphi}) + \quad (10)\right.$$
$$\left. (r_{US} r_{BS} e^{-i\Delta\varphi})^2 + \ldots + (r_{US} r_{BS} e^{-i\Delta\varphi})^n\right] =$$
$$\Psi(o, t)_{B1} = \frac{1}{1 - r_{US} r_{BS} e^{-i\Delta\varphi}} = t_{US}\Psi(o, t)_0 \frac{r_{BS} e^{-i\Delta\varphi'}}{1 - r_{US} r_{BS} e^{-i\Delta\varphi}}.$$

Based on the equations (5) and (10), the wave function of the total emitted light at a viewing angle $\theta'$ can be expressed using the equation (11):

$$\Psi(o, t)_C = \Psi(o, t)_A + \Psi(o, t)_B = t_{US}\Psi(o, t)_0 \frac{1 + r_{BS} e^{-i\Delta\varphi'}}{1 - r_{US} r_{BS} e^{-i\Delta\varphi}} = \quad (11)$$

$$t_{US}\Psi(o, t)_0 \frac{(1 + r_{BS}\cos\Delta\varphi') - i(r_{BS}\sin\Delta\varphi')}{(1 - r_{BS} r_{US}\cos\Delta\varphi) - i(r_1 r_2 \sin\Delta\varphi)}.$$

The gain coefficient of the light intensity due to the microcavity effect can be expressed using the equation (12):

$$\frac{I_C(\lambda)}{I_N(\lambda)} = \left|\frac{\Psi(o, t)_C}{2\Psi(o, t)_O}\right|^2 = \left|\frac{t_{US}(1 + r_{BS}\cos\Delta\varphi') - i(r_{BS}\sin\Delta\varphi')}{2(1 - r_{BS} r_{US}\cos\Delta\varphi) - i(r_1 r_2\sin\Delta\varphi)}\right|^2 = \quad (12)$$

$$\frac{(1 - R_{US})\left[1 + R_{BS} + 2R_{BS}^{0.5}\cos\left(\frac{4\pi nx\cos\theta}{\lambda} + \varphi'\right)\right]}{4(1 + R_{BS} R_{US} - 2(R_{BS} R_{US})^{0.5}}$$
$$\cos\left(\frac{4\pi nd\cos\theta + 4\pi n' L\cos\theta'}{\lambda} + \varphi\right)\right).$$

In the equation (12), the relationship among the gain coefficient of the light intensity due to the microcavity effect, the gap distance L of the tunable gap G, and the wavelength of light in a free space is established. Further, optical loss due to the microcavity may be considered in calculating the gain coefficient.

An effect of the gap distance L of the tunable gap G on a maximum-gain wavelength $\lambda_{max}$ can be expressed using the equation (13):

$$m\frac{\lambda\max}{2} = \quad (13)$$
$$n' L\cos\theta' + \sum_i n_i d_i \cos\theta_i + \left|\frac{\varphi\lambda}{4\pi}\right| = n' L\cos\theta' + nd\cos\theta + \left|\frac{\varphi\lambda}{4\pi}\right|;$$

wherein m stands for a number of modes; $n_i$ stands for refractive indexes of various layers of the organic light emitting diode 90; $d_i$ stands for thicknesses of various layers of the organic light emitting diode 90; and $\theta_i$ stands for angles of refraction of various layers of the organic light emitting diode 90.

Figure 5:
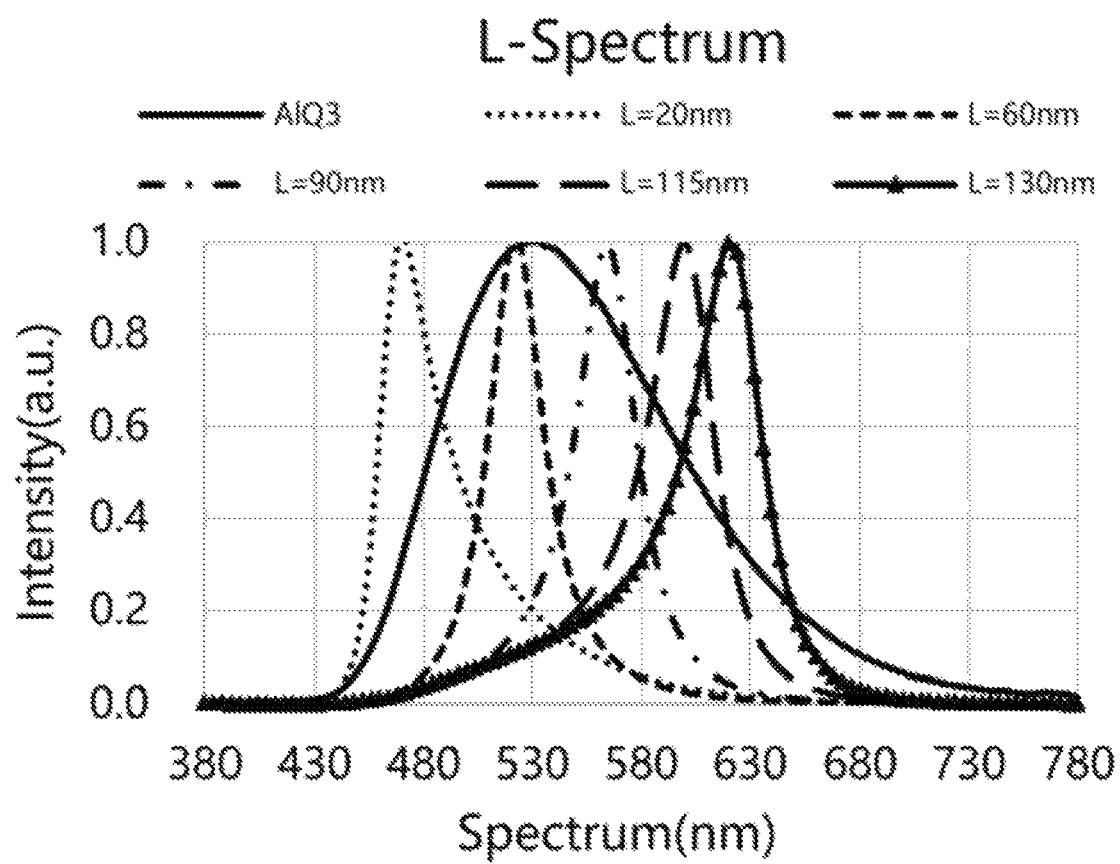
FIG. 5 illustrates the correlation between a gap distance L of the tunable gap and a wavelength of light emitted from the organic light emitting diode assembly.
Figure 6:
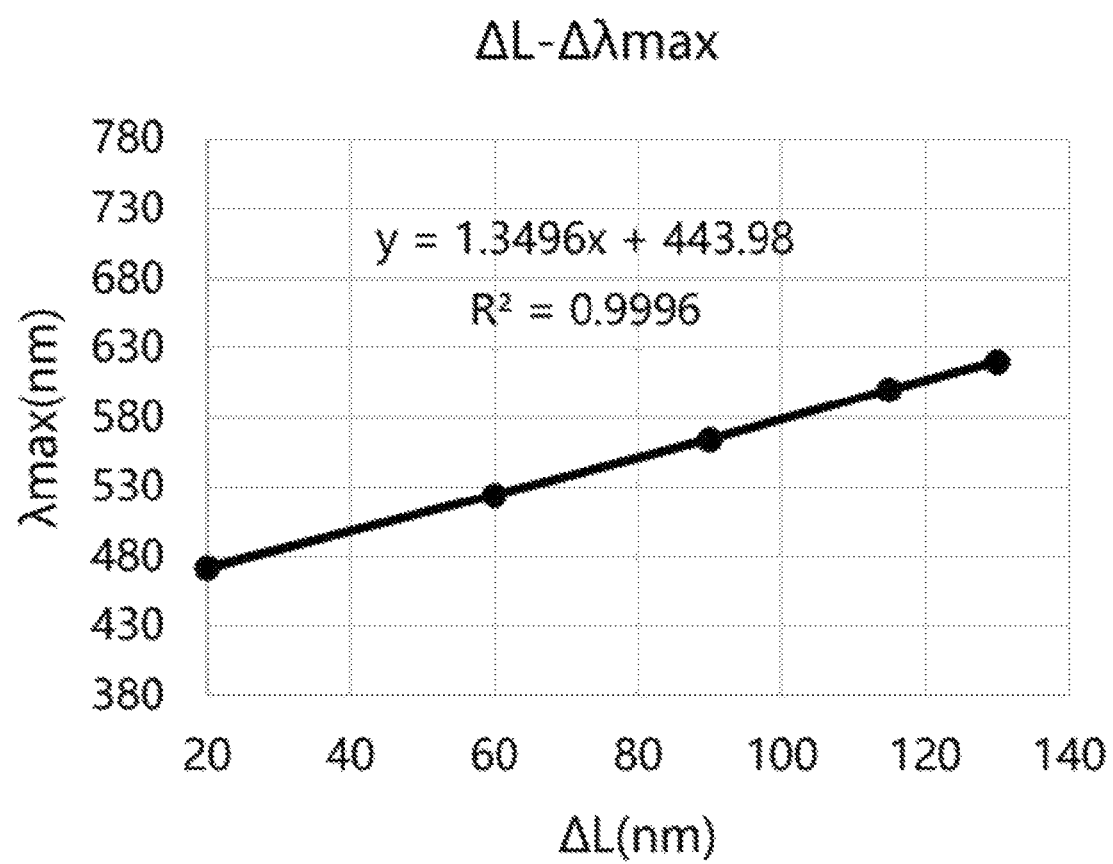
FIG. 6 illustrates the correlation between a change $\Delta L$ in a gap distance and a maximum-gain wavelength.

FIG. 5 illustrates the correlation between a gap distance L of the tunable gap and a wavelength of light emitted from the organic light emitting diode assembly. Referring to FIG. 5, AlQ3 stands for an organic light emitting diode assembly in which the gap distance is zero, e.g., a conventional organic light emitting diode assembly as a control; and L stands for the gap distance of the tunable gap in various organic light emitting diode assemblies in which the gap distance L is greater than zero and is denoted in FIG. 5. As shown in FIG. 5, by changing the gap distance L of the tunable gap, a color of light emitted from the organic light emitting diode assembly may be modulated in response to the change in the gap distance L. For example, when the gap distance L is 20 nm, the emitted light has a wavelength of 472 nm (blue light); when the gap distance L is 60 nm, the emitted light has a wavelength of 524 nm (green light); when the gap distance L is 90 nm, the emitted light has a wavelength of 564 nm (yellow light); when the gap distance L is 115 nm, the emitted light has a wavelength of 600 nm (orange light); and when the gap distance L is 130 nm, the emitted light has a wavelength of 620 nm (red light);

FIG. 6 illustrates the correlation between a change $\Delta L$ in a gap distance and a maximum-gain wavelength. Referring to FIG. 6, the change $\Delta L$ in a gap distance has a linear correlation with a change $\Delta\lambda_{max}$ in the maximum-gain wavelength $\lambda_{max}$.

Figure 7:
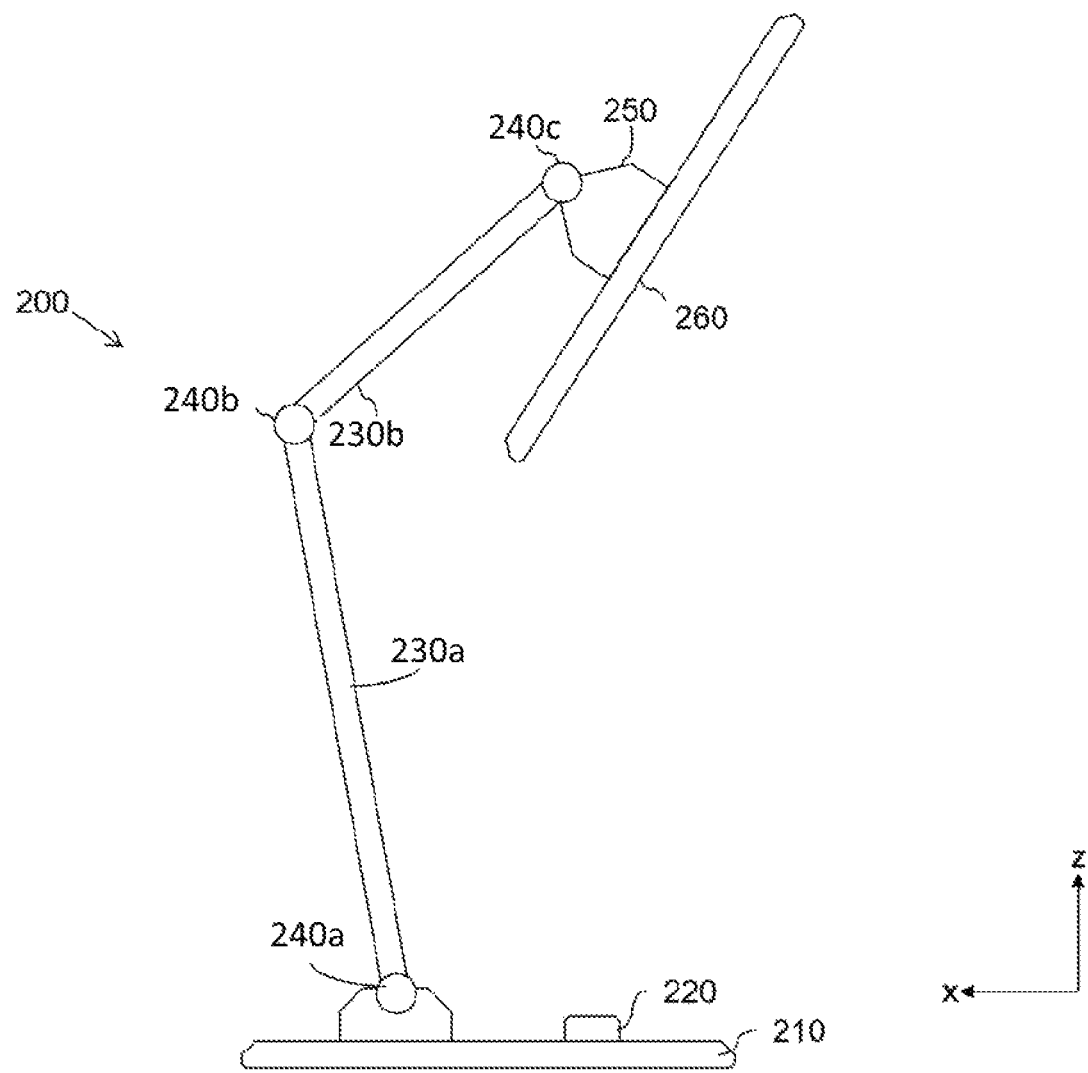
FIG. 7 is a side view of a light source in some embodiments according to the present disclosure.
Figure 8:
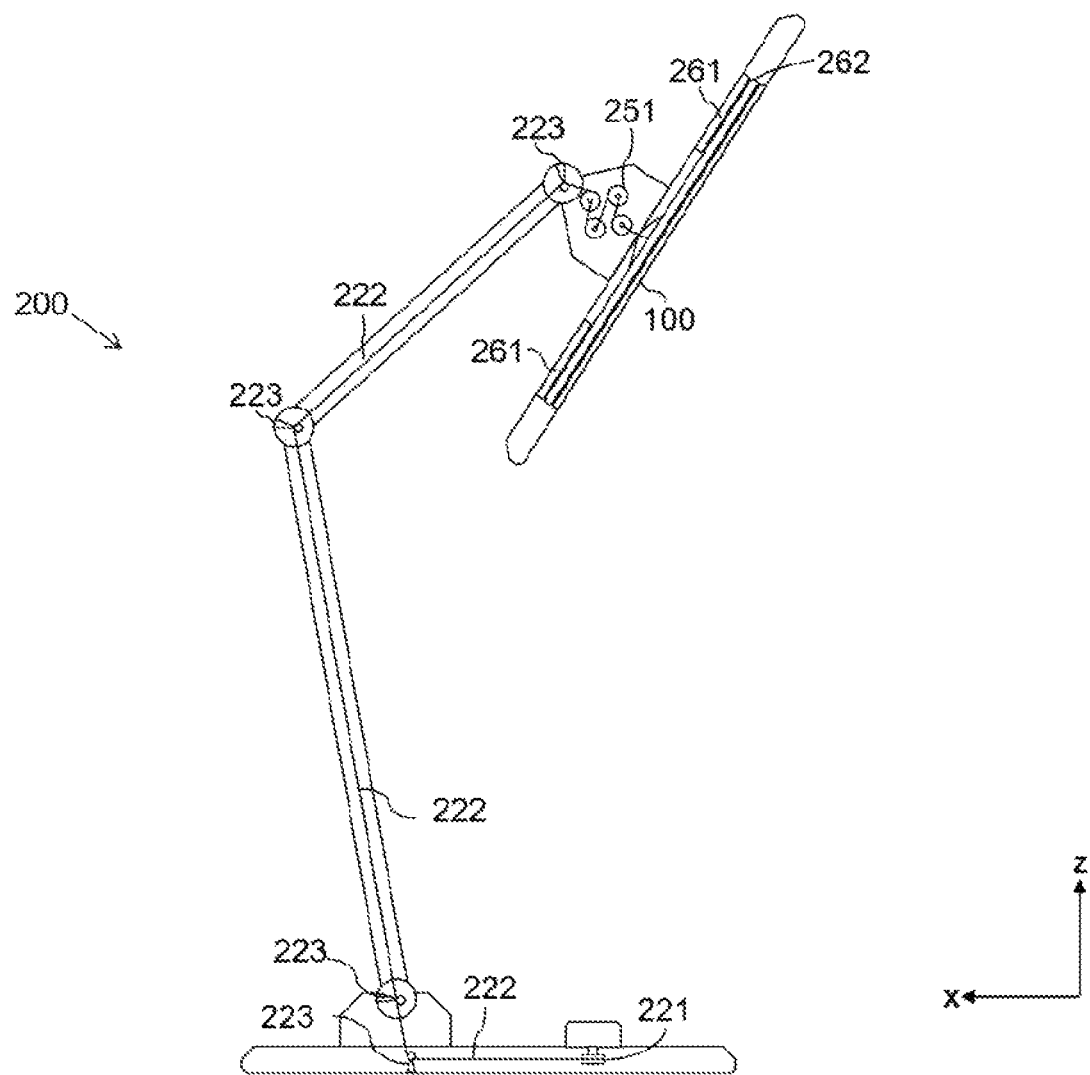
FIG. 8 is a cross-sectional view of a light source in some embodiments according to the present disclosure.
Figure 9:
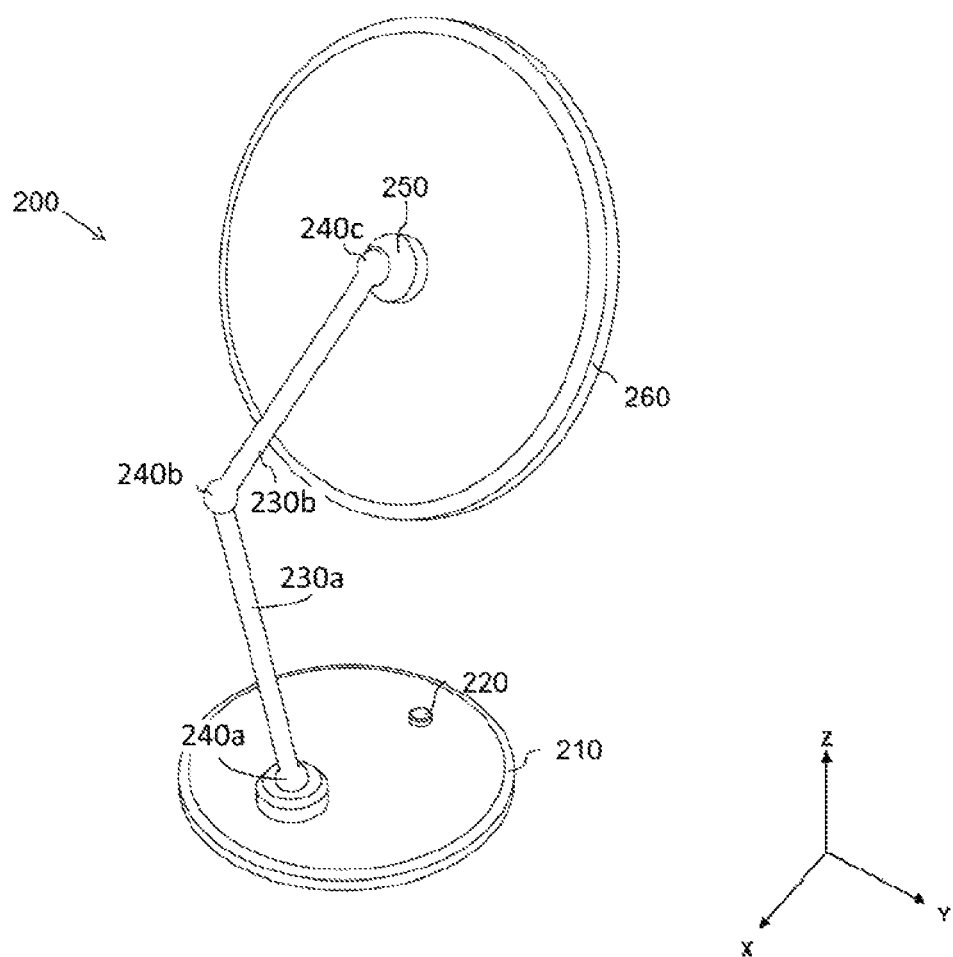
FIG. 9 is a perspective view of a light source in some embodiments according to the present disclosure.

In another aspect, the present disclosure provides a light source having an organic light emitting diode assembly described herein or fabricated by a method described herein. In some embodiments, the light source further includes an actuator for controlling the gap distance of the tunable gap. FIG. 7 is a side view of a light source in some embodiments according to the present disclosure. FIG. 8 is a cross-sectional view of a light source in some embodiments according to the present disclosure. FIG. 9 is a perspective view of a light source in some embodiments according to the present disclosure. Referring to FIGS. 7 to 9, the light source 200 in some embodiments includes an organic light emitting diode assembly 100 as described herein. The light source 200 in some embodiments further includes a base 210, a controller knob 220 on the base 210, a first strut 230a connected to the base 210 through a first connecting joint 240a, a second strut 230b connected to the first strut 230a through a second connecting joint 240b, a change-speed gear box 250 connected to the second strut 230b through a third connecting joint 240c, and a lamp head 260. The base 210, the first strut 230a, the second strut 230b, the first connecting joint 240a, the second connecting joint 240b, and the third connecting joint 240c serve as support for the light source 200. Each of the first connecting joint 240a, the second connecting joint 240b, and the thud connecting joint 240c are capable of rotating within a certain angle, thereby adjusting the position of the lamp head 260. The controller knob 220 is configured to control the gap distance of the tunable gap in the organic light emitting diode assembly 100. The change-speed gear box 250 is configured to control the speed of the transmission line provided, by the controller knob 220, thereby fine-tuning the gap distance of the tunable gap in the organic light emitting diode assembly 100.

Referring to FIG. 8, the controller knob 220 is operably coupled to a driving pulley 221, around which a transmission line 222 is wound for multiple turns. The transmission line 222 is operably connected to a plurality of change-speed gears 251 in the change-speed gear box 250 through a plurality of fixed pulleys 223. In FIG. 8, each of the plurality of fixed pulleys 223 is positioned at one of the first connecting joint 240a, the second connecting joint 240b, and the third connecting joint 240c. After the transmission speed of the transmission line 222 is reduced by four change-speed gears 251 in the change-speed gear box 250, the transmission line 222 is operably coupled to a rigid support plate 262 in the lamp head 260. The rigid support plate 262 is sandwiched between one or more resilient support pad 261 and the organic light emitting diode assembly 100. The resilient support pad 261 applies a compressive force on the rigid support plate 262 along a direction substantially perpendicular to a surface of the organic light emitting diode assembly 100. The transmission line 222 applies a pulling force on the rigid support plate 262 along a direction substantially opposite to the direction of the compressive force applied by the resilient support pad 261. The magnitude of the compressive force applied to the organic light emitting diode assembly 100 by the resilient support pad 261 can be controlled by changing the magnitude of the pulling force applied to the rigid support plate 262. Thus, the magnitude of the compressive force applied to the organic light emitting diode assembly 100 can be precisely controlled by the controller knob 220 through the transmission line 222, thereby actuating the gap distance of the tunable gap in the organic light emitting diode assembly 100. A color of light emitted from the organic light emitting diode assembly 100 can be fine-tuned in response to a change in the gap distance.

Figure 10:
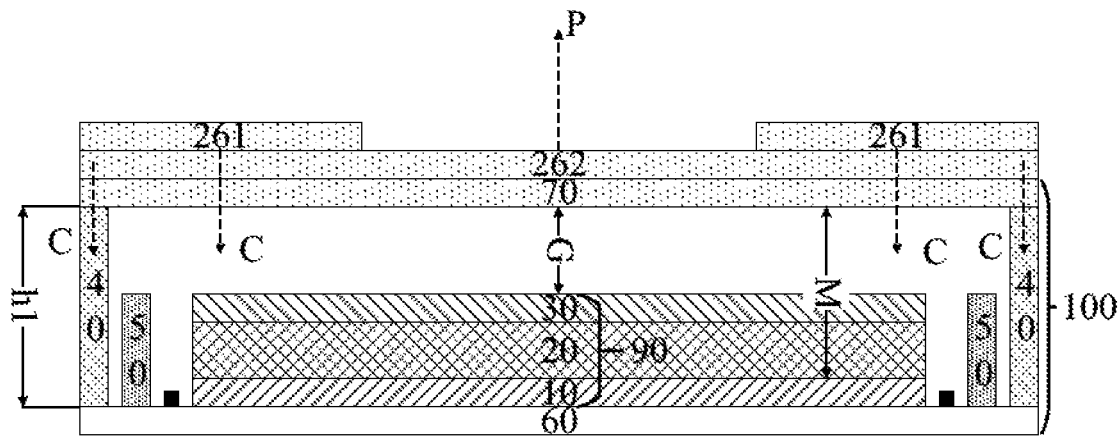
FIG. 10 is a diagram illustrating an actuator for controlling the gap distance of a tunable gap in an organic light emitting diode assembly in some embodiments according to the present disclosure.

Accordingly, in some embodiments, the light source 200 includes an actuator configured to control the gap distance of the tunable gap in the organic light emitting diode assembly 100. Optionally, the actuator is configured to control a magnitude of a compressive force applied on a surface of the organic light emitting diode assembly 100 (e.g., on a surface of the second base substrate 70 or on a surface of the first base substrate 60). FIG. 10 is a diagram illustrating an actuator for controlling the gap distance of a tunable gap in an organic light emitting diode assembly in some embodiments according to the present disclosure. Referring to FIG. 10 and FIG. 8, the actuator in some embodiments includes a rigid support plate 262 and a resilient support, pad 261. The resilient support pad 261 is configured to apply a compressive force C on the organic light emitting diode assembly 100. The compressive force C is in turn applied to the elastic spacer layer 40, reducing the height h1 of the elastic spacer layer 40. The rigid support plate 262 is configured to apply a pulling force P on the resilient support pad 261, compensating the compressive force C applied on the organic light emitting diode assembly 100 and the elastic spacer layer 40. When the magnitude of the pulling force P increases, the height h1 of the elastic spacer layer 40 increases, thereby increasing the gap distance of the tunable gap G. When the magnitude of the pulling force P decreases, the height h1 of the elastic spacer layer 40 decreases, thereby decreasing the gap distance of the tunable gap G.

Figure 11:
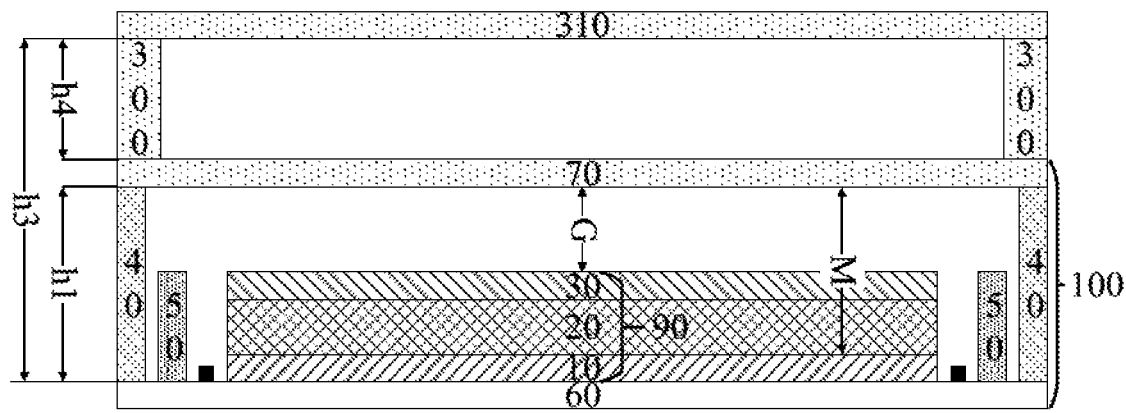
FIG. 11 is a diagram illustrating an actuator for controlling the gap distance of a (unable gap in an organic light emitting diode assembly in some embodiments according to the present disclosure.

The gap distance of the tunable gap G may be actuated mechanically as shown in FIG. 10. In some embodiments, the gap distance of the tunable gap G may be actuated by an electrical signal. FIG. 11 is a diagram illustrating an actuator for controlling the gap distance of a tunable gap in an organic light emitting diode assembly in some embodiments according to the present disclosure. Referring to FIG. 11, the actuator in some embodiments includes an electroactive layer 300 and a support plate 310. The electroactive layer 300 is connected (directly or indirectly) to the support plate 310 and the organic light emitting diode assembly 100. Optionally, the distance h3 between the support plate 310 and the first base substrate is fixed, whereas the height h1 of the elastic spacer layer 40 and the height h4 of the electroactive layer 300 are variable.

In some embodiments, the height h4 of the electroactive layer 300 increases when an electrical signal is applied to the electroactive layer 300. Consequently, the electroactive layer 300 applies a compressive force on the organic light emitting diode assembly 100 (e.g., on a surface of the second base substrate 70, the height h1 of the elastic spacer layer 40 decreases whereas the distance h3 remains substantially unchanged. The gap distance G of the tunable gap decreases as the height h1 of the elastic spacer layer 40 decreases.

In some embodiments, the height h4 of the electroactive layer 300 decreases when an electrical signal is applied to the electroactive layer 300. The electroactive layer 300 applies a pulling force on the organic light emitting diode assembly 100 (e.g., on a surface of the second base substrate 70), Consequently, the height h1 of the elastic spacer layer 40 increases whereas the distance h3 remains substantially unchanged. The gap distance G of the tunable gap increases as the height h1 of the elastic spacer layer 40 increases.

The electroactive layer 300 is made of an electroactive material. As used herein the term "electroactive material" refers to a material that reversibly changes one or more characteristic body dimension by an amount depending on an applied electrical voltage. As used herein, the term "electroactive layer" refers to a layer in the present light source that includes an electroactive material, and is capable of reversibly changing one or more characteristic body dimension by an amount depending on an applied electrical voltage. Optionally, the electroactive material is an electrostrictive material. Stress and strain response of the electrostrictive material to an electric field is proportional to the square of the electric field. Optionally, the electroactive material is a piezoelectric material. Stress and strain response of the piezoelectric material to an electric field is proportional to the electric field.

Any appropriate electrostrictive material may be used for making the electroactive layer, e.g., electrostrictive ceramics, electrostrictive polymers, electrostrictive valves, etc. Examples of appropriate electrostrictive materials include, but are not limited to, a polyurethane containing material (e.g., a doped polyurethane material), polyvinylidene fluoride, lead magnesium niobate, lead magnesium niobate-lead titanate, lanthanum doped lead zirconate titanate, barium doped lead zirconate titanate, and various substitutes and derivatives thereof (e.g., doped with one or more dopant).

Any appropriate piezoelectric material may be used for making the electroactive layer. Examples of appropriate piezoelectric materials include, but are not limited to, lead zirconium titanate, berlinite, zinc oxide, barium titanate, lead titanate, and various substitutes and derivatives thereof (e.g., doped with one or more dopant).

In some embodiments, the light source is a back light of a display apparatus.

In another aspect, the present disclosure provides a display apparatus having a back light described herein or fabricated by a method described herein. Examples of appropriate display apparatuses include, but are not limited to, an electronic paper, a mobile phone, a tablet computer, a television, a monitor, a notebook computer, a digital album, a GPS, etc.

In another aspect, the present disclosure provides a method of fabricating an organic light emitting diode assembly. FIG. 12 is a flow chart illustrating a method of fabricating an organic light emitting diode assembly in some embodiments according to the present disclosure. Referring to FIG. 12, the method in some embodiments includes forming an organic light emitting diode on a first base substrate; and forming a second base substrate on a side of the organic light emitting diode distal to the first base substrate. The organic light emitting diode and the second base substrate are formed to be spaced apart from each other by a tunable gap. A gap distance of the tunable gap is formed to be tunable such that a color of light emitted from the organic light emitting diode assembly is tunable in response to a change in the gap distance. Optionally, a change in the gap distance is substantially linearly correlated with a change in a maximum-gain wavelength of light emitted from the organic light emitting diode assembly.

In some embodiments, the method includes forming a microcavity in the organic light emitting diode assembly. Optionally, the microcavity is formed so that a light path in the microcavity extends through the tunable gap; and the gap distance of the tunable gap is tunable such that a total light path distance of the microcavity is tunable in response to the change in the gap distance. Optionally, the second electrode is formed using a substantially transparent conductive material. Optionally, the second base substrate is formed using a reflective material or a transflective material. Optionally, the first electrode is formed using a reflective conductive material or a transflective conductive material. Optionally, the first base substrate is formed using a reflective material or a transflective material.

Optionally, the first electrode is formed using a reflective conductive material, the second electrode is formed using a substantially transparent conductive material, and the second base substrate is formed using a transflective material. The microcavity is formed between the first electrode which is reflective and the second base substrate which is transflective.

Optionally, the first electrode is formed using a transflective conductive material, the second electrode is formed using a substantially transparent conductive material, and the second base substrate is formed using a transflective material. Optionally, the first base substrate is formed using a substantially transparent material. The microcavity is formed between the first electrode and the second base substrate, both of which are transflective.

Optionally, the first base substrate is formed using a reflective material, the first electrode is formed using a substantially transparent conductive material, the second electrode is formed using a substantially transparent conductive material, and the second base substrate is formed using a transflective material. The microcavity is formed between the first base substrate which is reflective and the second base substrate which is transflective.

Optionally, the first base substrate is formed, using a transflective material, the first electrode is formed using a substantially transparent conductive material, the second electrode is formed using a substantially transparent conductive material, and the second base substrate is formed using a transflective material. The microcavity is formed between the first base substrate and the second base substrate, both of which are transflective.

Optionally, the first base substrate is formed using a transflective material, the first electrode is formed using a substantially transparent conductive material, the second electrode is formed using a substantially transparent conductive material, and the second base substrate is formed using a reflective material. The microcavity is formed between the first base substrate which is transflective and the second base substrate which is reflective.

In some embodiments, the method further includes thrilling an elastic spacer layer spacing apart the organic light emitting diode and the second base substrate by the tunable gap. Optionally, the elastic spacer layer is capable of undergoing deformation in response to an external force thereby actuating the gap distance.

In some embodiments, the method further includes forming a rigid spacer layer on the first base substrate. Optionally, a height of the rigid spacer layer relative to the first base substrate is less than a height of the elastic spacer layer relative to the first base substrate when the gap distance is greater than zero.

In some embodiments, the step of forming the organic light emitting diode includes forming a first electrode on the first base substrate; forming an organic layer on a side of the first electrode distal to the first base substrate; and forming a second electrode on a side of the organic layer distal to the first electrode. The organic layer is formed to include an organic light emitting layer.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. An organic light emitting diode assembly, comprising:
a first base substrate;
an organic light emitting diode on the first base substrate;
a second base substrate on a side of the organic light emitting diode distal to the first base substrate;
an elastic spacer layer; and
a rigid spacer layer on the first base substrate;
wherein the organic light emitting diode and the second base substrate are spaced apart from each other by a tunable gap;
a gap distance of the tunable gap is tunable such that a color of light emitted from the organic light emitting diode assembly is tunable in response to a change in the gap distance;
the elastic spacer layer spaces apart the organic light emitting diode and the second base substrate by the tunable gap;
the elastic spacer layer is capable of undergoing deformation in response to an external force thereby actuating the gap distance; and
a height of the rigid spacer layer relative to the first base substrate is less than a height of the elastic spacer layer relative to the first base substrate when the gap distance is greater than zero.

2. The organic light emitting diode assembly of claim 1, comprising a microcavity;
wherein a light path in the microcavity extends through the tunable gap; and
the gap distance of the tunable gap is tunable such that a total light path distance of the microcavity is tunable in response to the change in the gap distance.

3. The organic light emitting diode assembly of claim 1, wherein a change in the gap distance is substantially linearly correlated with a change in a maximum-gain wavelength of light emitted from the organic light emitting diode assembly.

4. The organic light emitting diode assembly of claim 1, wherein the organic light emitting diode comprises:

a first electrode on the first base substrate;
an organic layer on a side of the first electrode distal to the first base substrate; and
a second electrode on a side of the organic layer distal to the first electrode;
wherein the organic layer comprises an organic light emitting layer.

5. The organic light emitting diode assembly of claim 4, wherein the second electrode is a substantially transparent electrode; and
the second base substrate is a reflective substrate or a transflective substrate.

6. The organic light emitting diode assembly of claim 4, wherein the first electrode is a reflective electrode or a transflective electrode.

7. The organic light emitting diode assembly of claim 4, wherein the first base substrate is a reflective substrate or a transflective substrate.

8. A light source, comprising the organic light emitting diode assembly of claim 1.

9. The light source of claim 8, further comprising an actuator configured to control the gap distance of the tunable gap.

10. The light source of claim 9, wherein the actuator comprises a rigid support plate and a resilient support pad;
the resilient support pad is configured to apply a compressive force on the organic light emitting diode assembly; and
the rigid support plate is configured to apply a pulling force on the resilient support pad.

11. The light source of claim 10, further comprising a transmission line operably coupled to the rigid plate support for providing the pulling force.

12. The light source of claim 11, further comprising a change-speed gear box operably coupled to the transmission line and configured to change a transmission speed of the transmission line; and
the change-speed gear box comprises a plurality of change-speed gears.

13. The light source of claim 12, further comprising a driving pulley, around which the transmission line is wound for multiple turns; and
the transmission line is operably connected to the plurality of change-speed gears in the change-speed gear box through one or more fixed pulleys.

14. The light source of claim 13, further comprising a controller knob operably coupled to the driving pulley configured to controlling a magnitude of the pulling force applied on the resilient support pad.

15. The light source of claim 9, wherein the actuator comprises a support plate and an electroactive layer sandwiched between the support plate and the organic light emitting diode assembly; and
the electroactive layer is configured to exert a force to the elastic spacer layer in response to an electrical signal, thereby changing the gap distance of the tunable gap.

16. The light source of claim 15, further comprising a controller knob operably coupled to the electroactive layer configured to controlling a magnitude of the electrical signal applied on the electroactive layer.

17. The light source of claim 8, further comprising a base, a controller knob on the base, a lamp head for receiving the organic light emitting diode assembly, and one or more struts connecting the base to the lamp head.

18. A method of fabricating an organic light emitting diode assembly, comprising:
forming an organic light emitting diode on a first base substrate;

forming a second base substrate on a side of the organic light emitting diode distal to the first base substrate;

forming an elastic spacer layer; and forming a rigid spacer layer on the first base substrate;

wherein the organic light emitting diode and the second base substrate are formed to be spaced apart from each other by a tunable gap;

a gap distance of the tunable gap is formed to be tunable such that a color of light emitted from the organic light emitting diode assembly is tunable in response to a change in the gap distance;

the elastic spacer layer spaces apart the organic light emitting diode and the second base substrate by the tunable gap;

the elastic spacer layer is capable of undergoing deformation in response to an external force thereby actuating the gap distance; and a height of the rigid spacer layer relative to the first base substrate is less than a height of the elastic spacer layer relative to the first base substrate when the gap distance is greater than zero.

\* \* \* \* \*